(12) United States Patent
Chang

(10) Patent No.: US 11,398,431 B2
(45) Date of Patent: Jul. 26, 2022

(54) THROUGH-SILICON VIA FOR HIGH-SPEED INTERCONNECTS

(71) Applicant: Marvell Asia Pte Ltd., Singapore (SG)

(72) Inventor: Runzi Chang, Saratoga, CA (US)

(73) Assignee: MARVELL ASIA PTE LTD, Singapore (SG)

( * ) Notice: Subject to any disclaimer, the term of this patent is extended or adjusted under 35 U.S.C. 154(b) by 0 days.

(21) Appl. No.: 17/158,041

(22) Filed: Jan. 26, 2021

(65) Prior Publication Data

US 2021/0233853 A1 Jul. 29, 2021

Related U.S. Application Data

(60) Provisional application No. 62/966,915, filed on Jan. 28, 2020.

(51) Int. Cl.
| | |
|---|---|
| *H01L 23/538* | (2006.01) |
| *H01L 21/48* | (2006.01) |
| *H01L 21/768* | (2006.01) |

(52) U.S. Cl.
CPC ........ *H01L 23/5384* (2013.01); *H01L 21/486* (2013.01); *H01L 21/76802* (2013.01); *H01L 23/5386* (2013.01)

(58) Field of Classification Search
CPC ............... H01L 23/5384; H01L 21/486; H01L 21/76802; H01L 23/5386; H01L 23/481; H01L 21/76898
See application file for complete search history.

(56) References Cited

U.S. PATENT DOCUMENTS

2012/0032326 A1\* 2/2012 Kim ...................... H01L 23/481
257/738

FOREIGN PATENT DOCUMENTS

| CN | 107658262 A | \* | 2/2018 |
|---|---|---|---|
| CN | 209401619 U | \* | 9/2019 |

\* cited by examiner

*Primary Examiner* — Selim U Ahmed
*Assistant Examiner* — Evan G Clinton

(57) ABSTRACT

A device includes a semiconductor substrate having first and second surfaces facing one another, and multiple through-silicon vias (TSVs). The TSVs are formed through the substrate between the first and second surfaces, at least a first TSV of the TSVs includes: (i) an electrically conductive interconnect, which is formed within the first TSV and is configured to conduct an electrical signal between the first and second surfaces, and (ii) an attenuation layer, which is formed within the first TSV, between the substrate and the electrically conductive interconnect, the attenuation layer configured to attenuate interference between electrical signals carried by two or more of the TSVs.

22 Claims, 2 Drawing Sheets

THROUGH-SILICON VIA FOR HIGH-SPEED INTERCONNECTS

CROSS-REFERENCE TO RELATED APPLICATIONS

This application claims the benefit of U.S. Provisional Patent Application 62/966,915, filed Jan. 28, 2020, whose disclosure is incorporated herein by reference.

FIELD OF THE DISCLOSURE

The present disclosure relates generally to semiconductor devices, and particularly to through-silicon vias (TSVs).

BACKGROUND

Various techniques are known in the art for interconnecting multiple devices assembled together in a 3D package. One example technique uses through-silicon vias (TSVs).

The description above is presented as a general overview of related art in this field and should not be construed as an admission that any of the information it contains constitutes prior art against the present patent application.

SUMMARY

An embodiment that is described herein provides a device, including a semiconductor substrate having first and second surfaces facing one another, and multiple through-silicon vias (TSVs). The TSVs are formed through the substrate between the first and second surfaces, at least a first TSV of the TSVs includes: (i) an electrically conductive interconnect, which is formed within the first TSV and is configured to conduct an electrical signal between the first and second surfaces, and (ii) an attenuation layer, which is formed within the first TSV, between the substrate and the electrically conductive interconnect, the attenuation layer configured to attenuate interference between electrical signals carried by two or more of the TSVs.

In some embodiments, the attenuation layer includes a dielectric layer having a dielectric constant smaller than 2.9. In other embodiments, the attenuation layer includes a dielectric layer having a thickness greater than 50 nm. In yet other embodiments, the multiple TSVs include: (i) one or more first TSVs having the attenuation layer, the one or more first TSVs being configured to conduct first signals, and (ii) one or more second TSVs, which are separate from the first TSVs, and have a barrier layer configured to prevent diffusion between the substrate and the electrically conductive interconnect, the one or more second TSVs being configured to conduct second signals, different from the first signals.

In an embodiment, at least one of the first TSVs is positioned between two or more of the second TSVs. In another embodiment, the attenuation layer and the barrier layer differ in thickness from one another. In yet another embodiments, the attenuation layer and the barrier layer differ in dielectric constant from one another.

In some embodiments, the attenuation layer and the barrier layer differ in material composition from one another. In other embodiments, at least one of the first TSVs and at least one of the second TSVs differ in diameter from one another. In yet other embodiments, the first TSVs are larger in diameter than the second TSVs.

In an embodiment, the first TSVs are configured to carry data signals, and at least some of the second TSVs are configured to carry direct current (DC) signals. In another embodiment, the interference includes electrical-signal coupling between the electrical signals carried by two or more of the TSVs.

There is additionally provided, in accordance with an embodiment, a method for producing a device, the method including forming, through a substrate having first and second surfaces facing one another, multiple through-silicon vias (TSVs). An electrically conductive interconnect and an attenuation layer are formed within at least a first TSV of the TSVs. The electrically conductive interconnect is for conducting an electrical signal between the first and second surfaces, and the attenuation layer, which is formed between the substrate and the electrically conductive interconnect, is for attenuating interference between electrical signals carried by two or more of the TSVs.

The present disclosure will be more fully understood from the following detailed description of the embodiments thereof, taken together with the drawings in which:

DETAILED DESCRIPTION OF EMBODIMENTS

Figure 2:
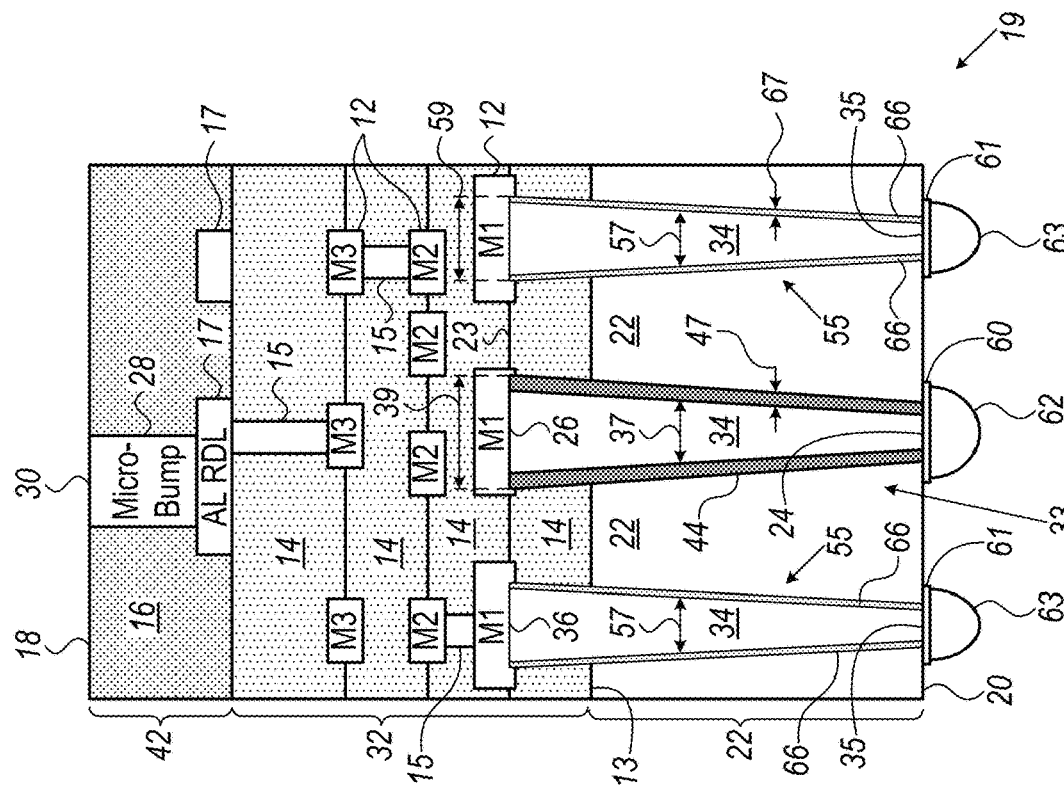
FIG. 2 is a schematic side view of 3D packaging applied to another electronic device, in accordance with another embodiment that is described herein.

Through-silicon via (TSV) technology can be implemented in three-dimensional (3D) and 2.5-dimensional (2.5D) homogeneous and heterogeneous integration of semiconductor devices. The 2.5D and 3D integration techniques typically comprise formation of one or more silicon interposers. Such interposers typically comprise electrical interconnections formed through a silicon substrate of one or more semiconductor devices packaged together. For example, TSVs may be implemented in 3D packaging of stacked high-speed semiconductor devices, such as devices that transfer data at rates greater than about 32 GBPS. Using TSVs improves packaging density, and improves the integrity of signals carried by the TSVs, compared to signals carried over bonded wires implemented for connecting between individually-packaged devices of package-on-package (PoP) assemblies.

At data transfer rates greater than about 32 GBPS, electrical signals carried by TSVs in a 3D package may be prone to interference cause by electrical signals carried by other TSVs of the 3D package. For example, high-speed signals carried by two different TSVs positioned in close proximity to one another, tend to exhibit coupling or cross-talk with one another. The interference may be caused, inter alia, due to the high relative permittivity of the silicon substrate, having a dielectric constant value of about 12 at room temperature.

Embodiments that are described herein provide techniques for reducing the aforementioned interference by integrating one or more attenuation layers in one or more of the TSVs. Such attenuation layers may be implemented, for example, in high-density TSVs carrying high-speed data signals.

In some embodiments, in a 3D package of semiconductor devices, at least one of the devices comprises a semiconductor substrate having first and second surfaces facing one another. The device comprises multiple TSVs formed, typically as round holes (also referred to herein as bores), through the substrate between the first and second surfaces. Some of the TSVs, also referred to herein as first TSVs, are designed to conduct electrical signals carrying data at a data transfer rate greater than about 32 GBPS, e.g., about 64 GBPS, 256 GBPS and even greater data rates.

In some embodiments, each of the first TSVs comprises an electrically conductive interconnect, which is formed within the hole of the first TSV, and is configured to conduct an electrical signal between first circuitry formed at the first surface, and second circuitry formed at the second surfaces.

In some embodiments, each of the first TSVs further comprises an attenuation layer, which is formed within the hole of the first TSV, between the substrate and the electrically conductive interconnect. The attenuation layer may have a dielectric constant of about 4.2 and a thickness greater than about 100 µm, which is thicker by an order of magnitude compared to a barrier layer that may be formed on other types of bores or holes in such semiconductor devices. In other embodiments, the attenuation layer may comprise low-k material having a dielectric constant between about 2.7 and 2.9, or an extreme low-k material having a dielectric constant between about 2.3 and 2.5. Based on the thickness and dielectric constants described above, the attenuation layer is configured to attenuate interference, such as signal-coupling or cross-talk, between electrical signals carried by two or more of the TSVs.

In some embodiments, one or more of the first TSVs may comprise additional layers, such as an adhesion layer formed between the conductive interconnect and the attenuation layer for improving the inter-layer adhesion, for example, between the conductive interconnect and the attenuation layer of the TSV. Moreover, (i) the attenuation layer may be coupled to a barrier layer that will be described in detail below, and (ii) the conductive interconnect may comprise a stack of layers comprising, for example, a liner layer, a seed layer and a bulk layer for improving the integrity of the high-speed electrical signals carried by the conductive interconnect.

In some embodiments, the attenuation layer may have a dielectric constant smaller than 2.9, typically obtained by implementing various types of low-k materials, which have a small dielectric constant in relation to silicon dioxide, or other types of layers used in semiconductor substrates or as layers formed within the multilayered structure of semiconductors devices. Additionally or alternatively, the attenuation layer may have a thickness larger than about 50 nm, and typically larger than about 100 nm. Note that the bore diameter of the first TSVs is typically limited by design rules imposed when manufacturing the semiconductor device. Therefore, the thickness of the attenuation layer may be limited (e.g., to a thickness smaller than about 200 nm) so as to enable sufficient thickness of the conductive interconnect described above.

In some cases, some of the aforementioned semiconductor devices stacked in the 3D package, are configured to conduct different signals that are not prone to signal integrity issues, such as direct current (DC) power/ground (PG) signals. In some embodiments, one or more of the packaged semiconductor devices may comprise second TSVs, which are separate or different from the first TSVs. The second TSVs have an electrically conductive interconnect, and a barrier layer configured to prevent diffusion and other types of interactions between the substrate and the electrically conductive interconnect. In some embodiments, the barrier layer may comprise oxide-based or nitride-based compounds having covalent bonds between the atoms. Such covalent bonds produce a material structure that prevents diffusion of atoms or ions between the electrically conductive interconnects and the substrate. The barrier layer is typically thinner than the attenuation layer and may have a dielectric constant larger than about 2.9. For example, in some embodiments the barrier layer is made from a silica having a dielectric constant of about 4.2 and a thickness of about 10 nm.

The disclosed techniques improve the signal integrity and other electrical performance of devices stacked in a 3D package having TSVs, and improve the integration of devices of different types in small-footprint 3D packages.

The description above is presented as a general overview of embodiments of the present disclosure, which are described in detail herein.

Figure 1:
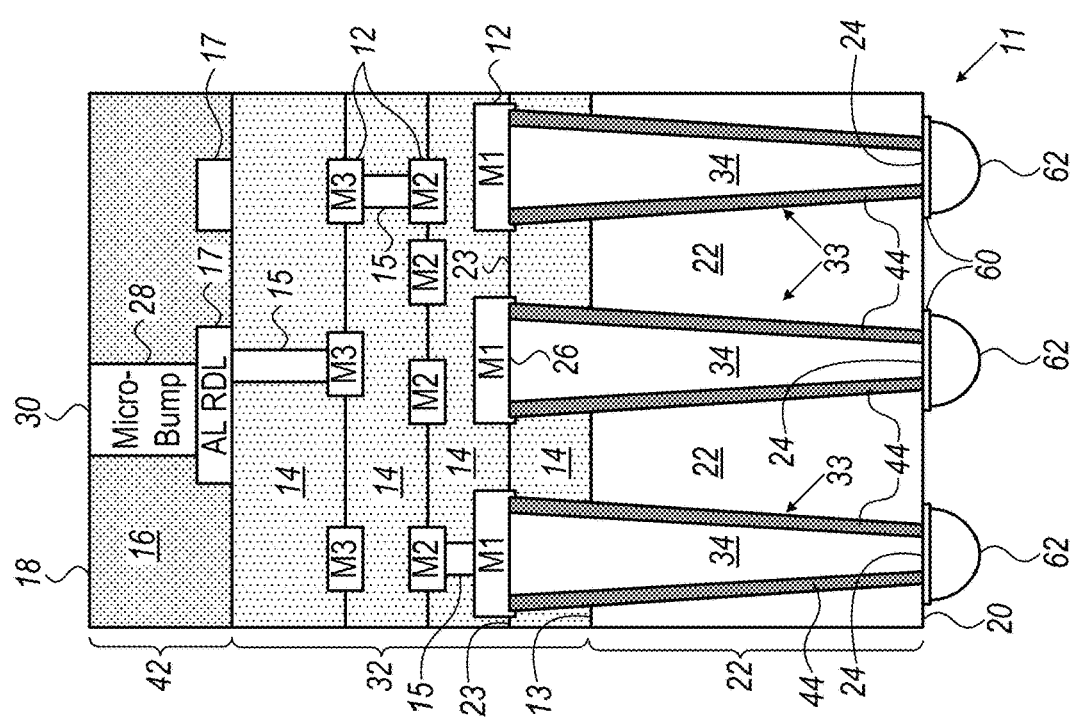
FIG. 1 is a schematic side view of three-dimensional (3D) packaging applied to an electronic device, in accordance with an embodiment that is described herein.

FIG. 1 is a schematic side view of three-dimensional (3D) packaging applied to an electronic device 11, in accordance with an embodiment that is described herein.

In some embodiments, device 11 comprises a semiconductor substrate 22, also referred to herein as a substrate 22, for brevity. Substrate 22 is typically made from silicon, or from any other suitable type of semiconductor material (e.g., gallium arsenide or germanium), or from any other suitable type of material and/or compound of materials. Note that in case the substrate is made from materials other than silicon, a via formed through the substrate, is referred to herein as a through semiconductor-substrate via (TSSV). Substrate 22 has an upper surface 13 and a lower surface 20, which is also the lower surface of device 11. Device 11 may comprise transistors, diodes and other active components (not shown), typically formed in close proximity to upper surface 13 using any suitable very large-scale integration (VLSI) production processes.

In some embodiments, device 11 comprises an interconnection module 32, which is configured to route electrical signals within device 11, e.g., between the components of device 11, and additional signals described herein. Interconnection module 32 comprises metal interconnects, in the present example (i) electrical traces 12, arranged in three layers of metal (e.g., copper) shown as M1, M2 and M3, and (ii) electrically-conductive vias 15 made from suitable metal (e.g., copper) for electrically connecting between the metal layers. Electrical traces 12 and vias 15 are both patterned in dielectric layers (DLs) 14, also referred to herein as inter-layer dielectric (ILD), using suitable VLSI production processes.

In some embodiments, device 11 comprises an input/output (IO) module 42, having an upper surface 18 that is also the upper surface of device 11, and multiple through-silicon vias (TSVs) 33 described in detail below. IO module 42 and TSVs 33 are configured to exchange electrical signals between interconnection module 32 of device 11, and external devices packaged in a 3D package comprising device 11 and additional devices (not shown) stacked together. IO module 42 comprises electrically-conductive IO layers patterned in one or more passivation layer(s) 16, which are configured to insulate device 11 from undesired environmental conditions (e.g., moisture and mechanical damage). The electrically-conductive IO layers comprise (i) electrical traces 17, such as redistribution layers (RDLs) made from aluminum or from any other suitable conductive metal, and (ii) micro-bumps 28, typically made from copper or aluminum or from other suitable electrically-conductive materials.

In some embodiments, the 3D package may comprise, inter alia, multiple vertically-stacked similar devices 11. In the present example, three vertically-stacked devices 11, referred to herein as a lower device (not shown), a middle device (shown as device 11 of FIG. 1), and an upper device (not shown). In this example configuration, when the middle device is placed over the lower device, lower surface 20 of the middle device, is electrically connected with upper surface 18 of the lower device. Similarly, when the upper device is placed over the middle device, lower surface 20 of the upper device, is electrically connected with upper surface 18 of the middle device. The electrical connection may be carried out, for example, using bumps described in detail below.

In such embodiments, IO module 42 of the middle device exchanges electrical signals with TSV 33 of the upper device, for example, when a surface 30 of micro-bump 28 is electrically connected with a surface 24 of a respective TSV 33.

In some embodiments, TSVs 33 are formed by etching a through hole through substrate 22, between surfaces 13 and 20. In the present example, TSVs 33 are also patterned in DL 14 between M1 and surface 13, so as to be electrically connected with M1 of electrical traces 12.

In some embodiments, each TSV 33 comprises an electrically conductive interconnect 34, which is made from copper or any other suitable conductive material, and is configured to carry an electrical signal between a surface 26 of TSV 33 (which is electrically connected to M1) and surface 24 of TSV 33 (which is electrically connected to surface 30 of the lower device). Note that in such embodiments, the electrical signal is carried by interconnect 34, between surfaces 13 and 20 of substrate 22. Moreover, TSV 33 may be formed by etching through DL 14 so that surface 26 is typically flush with a surface 23, which is the top surface of DL 14 limited between surfaces 13 and 23.

In other embodiments, device 11 may have one or more traces 12 formed over, or within, surface 13 (not shown in FIG. 1). In such embodiments, interconnect 34 of a respective TSV 33 may carry the electrical signal through substrate 22, between surfaces 13 and 20.

In high-performance VLSI devices (e.g., devices processing and/or carrying electrical signals having a data transfer rate of about 32 GBPS or greater), signal integrity constitutes a crucial success factor. TSVs are used as an alternative to wire-bonding and flip chips for producing 3D packages and 3D integrated circuits. Compared to alternative techniques, such as package-on-package (PoP), TSVs can be used for reducing the foot-print of a multi-devices packaging, and for improving the electrical performance (e.g., the quality of signals carried) by reducing the length of the connections between devices of the package. For example, the length of TSVs 33 may be between a few microns and about 300 μm, depending, inter alia, on the post-thinning thickness of substrate 22, whereas the typical length of wires used in wire-bonding of a PoP, is between about 700 μm and 1.5 mm. Shorter connections, such as TSV, improve the electrical performance of the packaged device(s), however, high-speed signals (e.g., having a data transfer rate greater than about 32 GBPS) carried by two or more TSVs 33, may have interference therebetween. Such interferences, such as but not limited to signal attenuation, signal coupling or cross-talk between signals, may damage the integrity of signals carried by TSVs 33.

In the context of the present disclosure and in the claims, the terms "about" or "approximately" for any numerical values or range of numerical values, indicate a suitable dimensional tolerance that allows the part or collection of components, or a physical parameter such as thickness, or a physical constant, to function for its intended purpose as described herein.

In some embodiments, at least one of TSVs 33, and in the present example all three TSVs 33, comprise a layer (not shown) of silica ($SiO_2$) having a thickness of about 10 nm or any suitable thickness between about 1 nm and 20 nm. In other embodiments, one or more of TSVs 33 may comprise a layer of silicon-nitride ($Si_3N_4$) instead of or in addition to the silica layer described above. In an embodiment, the silica or silicon-nitride layer may be used as a barrier layer as will be described in detail in FIG. 2 below.

In some embodiments, at least one of TSVs 33, and in the present example, depicted in FIG. 1, all three TSVs 33, comprise an attenuation layer 44, which is formed within TSV 33, between substrate 22 and electrically conductive interconnect 34. Note that in case one or more of TSVs 33 comprise the silica, attenuation layer 44 may be formed on the silica layer instead of on the surface of substrate 22. Attenuation layer 44 is configured to attenuate the aforementioned interference, and thereby, to retain the integrity of signals carried by TSVs 33.

In other embodiments, the configuration of one or more of TSVs 33 may exclude the barrier layer, so that attenuation layer 44 may be applied directly to the surface of substrate 22 within the aforementioned hole of TSV 33.

In some embodiments, one or more of TSVs may comprise an adhesion layer (not shown) formed between attenuation layer 44 and interconnect 34. The adhesion layer is typically made from titanium-nitride or any other suitable gluing layer, and is configured to improve the adhesion between attenuation layer 44 and interconnect 34.

In some embodiments, attenuation layer 44 may comprise a low-k (LK) dielectric layer (e.g., fluorine-doped silicon dioxide, and/or any suitable type of flowable low permittivity dielectric film) having a dielectric constant between about 2.9 and 2.7. The dielectric constant of a given substance is defined by the permittivity of the given substance, divided by the permittivity of a vacuum (which equals 1, by the definition of relative permittivity).

In other embodiments, attenuation layer 44 may comprise an extreme low-k (ELK) dielectric layer (e.g., carbon-doped silicon dioxide, and/or any suitable type of porous dielectric film) having a dielectric constant between about 2.5 and 2.3 or even lower. Such LK and ELK materials have lower conductivity compared to silicon dioxide, and therefore, are configured to have improved attenuation of interference between electrical signals carried by two or more of TSVs 33.

In yet other embodiments, attenuation layer 44 may comprise one or more layers of silica having a dielectric constant between about 4.2 and 3.6. Note that the dielectric constant of the silicon of substrate 22, is between 11 and 12, and therefore, may cause the aforementioned interference between the high-speed signals carried by two or more TSVs 33.

In some embodiments, the thickness of attenuation layer 44 may be determined based on the dielectric constant thereof, in general a greater dielectric constant requires a greater thickness of attenuation layer 44 so as to attenuate the interference. For example, attenuation layer 44 made from ELK may have a thickness greater than about 50 μm, and attenuation layer 44 made from silica may have a thickness greater than about 100 μm, so as to obtain a similar attenuation of the same interference. Note that, in a fixed hole diameter of TSV 33, a greater thickness of attenuation layer 44 reduces the thickness (and therefore the conductivity) of conductive interconnect 34, however, the formation of ELK-based conductive interconnect 34 may increase the production costs of device 11. Note that the outer diameter of TSVs 33 is limited by the design rules imposed on device 11 and the devices having an interface with device 11, thus, thicker attenuation layer 44 reduces the thickness of interconnect 34. Embodiments related to different thickness of layers formed within the TSV hole are described in detail in FIG. 2 below.

In some embodiments, device 11 is electrically connected to another device (e.g., the aforementioned lower device), which is electrically connected to surface 24, via electrical connectors. In the present example, the electrical connectors comprise (i) an under bump metallization (UBM) layer 60, which is formed on surface 24, and (ii) a bump 62.

In some embodiments, UBM 60 and bump 62 are configured to electrically connect between surface 24 of TSV 33 and surface 30 of the micro-bump of the lower device electrically connected to device 11 shown in FIG. 1.

In other embodiments, bumps 62 may be formed directly on surface 24 of TSV 33 and UBM 60 may be omitted from the configuration of device 11.

In some embodiments, TSVs 33 may be at least partially formed as part of the process for producing the active components on surface 13 of substrate 22, and interconnection module 32. For example, the TSV hole and deposition of the layers described above, may be carried out together with the production of interconnection module 32. In such embodiments, IO module 42 is formed thereafter followed by polishing the backside of substrate 22, as will be described in detail in FIG. 3 below. In the context of the present disclosure, a combination of IO module 42 and the TSVs is also referred to herein as an interposer, which is used for the assembly and 3D-packaging of device 11.

FIG. 2 is a schematic side view of 3D packaging applied to an electronic device 19, in accordance with another embodiment that is described herein.

In some embodiments, the configuration of device 19 may be implemented as a different section of device 11 shown in FIG. 1 above. In other words, the configurations of devices 11 and 19 may be implemented in different sections of the same semiconductor device. For example: in a given device, (i) the configuration of FIG. 1 may be implemented in a first section, which is configured to carry data signals, e.g., signals having data transfer rate greater than about 32 GBPS, and (ii) the configuration of FIG. 2 may be implemented in the given device in a second different section, which is configured to carry the data signals (e.g., in TSV 33) and power or ground signals (e.g., in TSVs 55). In the present example, interconnection module 32 and IO module 42 of device 19 are similar to that of device 11, and are described in detail in FIG. 1 above.

In some embodiments, devices 11 and 19 are configured to conduct various types of signals. For example, high-speed signals typically carry data at a transfer rate greater than 32 GBPS (e.g., 256 GBPS), and direct current (DC) power/ground (PG) signals that are not prone to the signal integrity issues described in FIG. 1 above.

In some embodiments, device 19 comprises TSVs of different types, which are configured to carry the different types of signals described above. In the present example TSV 33 serves as a data line, which is configured to carry the high-speed data signals, whereas TSVs 55 serve as power lines, which are configured to carry the PG signals.

In some embodiments, each TSV 55 comprises an electrically conductive interconnect 34, which is configured to carry the PG signals. Interconnect 34 has (i) an upper surface 36, typically flush with surface 26 and connected to M1 of electrical traces 12, and (ii) a lower surface 35 that is typically flush with surface 20 of substrate 22, and with surface 24 of TSV 33. Each TSV 55 further comprises a barrier layer 66, which is formed between substrate 22 and interconnect 34, and is configured to prevent diffusion between substrate 22 and interconnect 34.

In the context of the present disclosure and in the claims, the term "diffusion" refers to any sort of transfer carried out between interconnect 34 or other layers of TSV 55, and substrate 22. For example, transfer of copper atoms and/or ions from interconnect 34 to substrate 22.

In some embodiments, barrier layer 66 may comprise silica or other suitable type of diffusion barriers, such as silicon-nitride having a thickness 67 between about 1 nm and 20 nm.

In some embodiments, TSVs 33 and 55 may differ from one another in one or more aspects. In an embodiment, attenuation layer 44 and barrier layer 66 may differ in thickness from one another. In the present example, a thickness 47 of attenuation layer 44 is between about 50 nm and 200 nm, which is substantially greater than a thickness 67 of barrier layer 66, e.g., between about 1 nm and 20 nm, so as to attenuate or block interference in the high-speed signal carried by TSV 33. Additionally or alternatively, attenuation layer 44 and barrier layer 66 may differ in material composition, and typically in dielectric constant, from one another. In the present example, attenuation layer 44 comprises an ELK material having a dielectric constant of about 2.3 (for attenuating or blocking interference in the high-speed signal carried by TSV 33), and barrier layer 66 comprises silica having a dielectric constant of about 4.2.

In some embodiments, interconnect 34 of TSV 33 may have a thickness 37 greater than a thickness 57 of interconnect 34 of TSV 55, so as to conduct the aforementioned data signals, by TSV 33, at sufficiently-high speed without losing power or signal integrity due to insufficient conductivity of the interconnect.

In some embodiments, at least one of TSVs 33 and at least one of TSVs 55 may differ in diameter from one another. In the present example, a diameter 39 of TSV 33 is larger than a diameter 59 of TSV 55, so as to contain within the hole of TSV 33, the interconnect 34 (which is thicker than interconnect 34 of TSV 55) and attenuation layer 44 (which is typically thicker than barrier layer 66), as described above.

In other embodiments, TSVs 33 and 55 may have the same diameter. In one implementation, attenuation layer 44 may comprise ELK materials having dielectric constant sufficiently-low for attenuating interference in the high-speed signals carried by TSV 33, when attenuation layer 44 may have a thickness similar or even small compared that of barrier layer 66. In another implementation, attenuation layer 44 may be thicker than barrier layer 66, and therefore, interconnect 34 of TSV 55 may be slightly thicker than interconnect 34 of TSV 33.

In some embodiments, device 19 comprises a UBM 61, typically having the same material composition of UBM 60 and formed on surface 35, and a bump 63, typically having the same material composition of bump and formed on UBM 61. In an embodiment, when diameter 57 is smaller than diameter 37, the size of UBM 61 and bump 63 are smaller than the size of UBM 60 and bump 62, respectively, so as to match the diameters of the respective TSVs they are connected to, as shown in FIG. 2.

Note that by incorporating different diameters and/or different layer thickness and/or different material composition, in TSVs 33 and 55, device 19 may obtain the required electrical conditions for carrying (i) the high-speed signals in one or more TSVs 33, and (ii) the PG signals in one or more TSVs 55. Note that in this configuration device 19 complies with a broad range of design rules. For example, with the design rules imposed on device 11, and with the design rules imposed on the other devices integrated in the 3D package and interfacing with device 11.

In the context of the present disclosure, a combination of IO module 42 and TSVs 33 and 55, is also referred to herein as an interposer, which is used for the assembly and packaging of device 19.

This particular configuration of devices 11 and 19 are shown in FIGS. 1 and 2, respectively, by way of example, in order to illustrate certain problems that are addressed by disclosed embodiments and to demonstrate the application of these embodiments in enhancing the performance of such devices configured to process high-speed data as described above. The disclosed techniques, however, are by no means limited to this specific sort of example devices, and the principles described herein may similarly be applied to other sorts of electronic devices and modules. For example, the embodiments described above are applicable for any other types, dimensions and shapes of TSV holes and to layers within the TSVs and layers connected to the TSVs that may have any other suitable configuration and type of materials.

Figure 3:
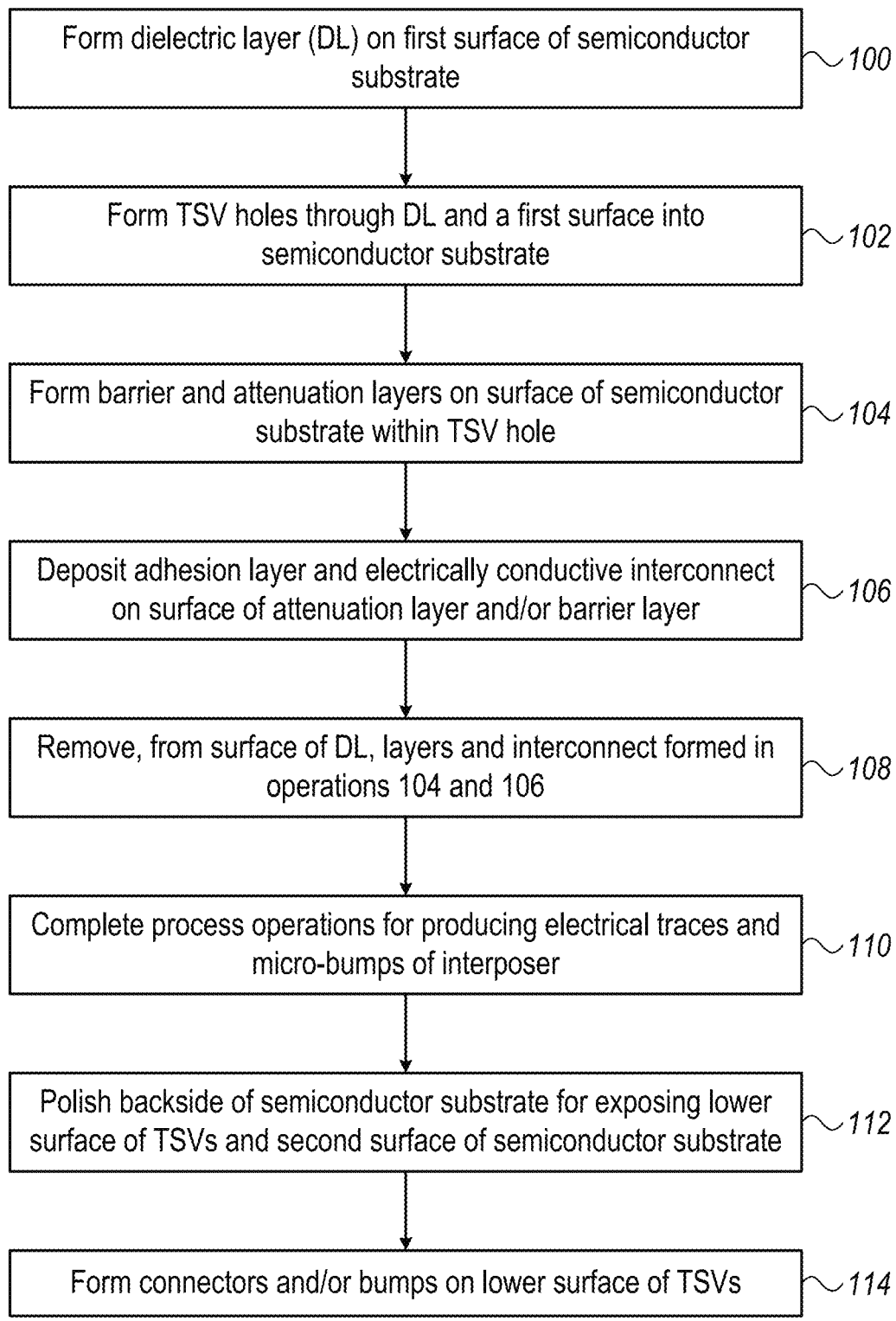
FIG. 3 is a flow chart that schematically illustrates a method for producing through-silicon vias (TSVs) in a 3D package of a device, in accordance with embodiments that are described herein.

FIG. 3 is a flow chart that schematically illustrates a method for producing TSVs 33 and 55 in a 3D package comprising devices 11 and 19, in accordance with embodiments that are described herein.

At the following operations, the method for producing devices 11, as well as device 19 and other types of VLSI devices, applies any suitable Complementary Metal Oxide Semiconductor (CMOS) processes, such as but not limited to: (a) thin-film (TF) deposition using chemical vapor deposition (CVD), metalorganic CVD (MOCVD), physical vapor deposition (PVD) also referred to herein as sputtering, and electroplating (EP) and electrochemical plating (ECP), (b) various types of reactive-ion etching (RIE), wet etching, and other types of etching processes, (c) photoresist (PR)-based photolithography, (d) polishing and planarization processes, such as chemical mechanical polishing (CMP) or applying polyimide and spinning for obtaining planar surfaces, or selective etch-back processes, (e) various processes of mask removal, such as but not limited to photoresist asking, photoresist stripping and hard-mask etching, and (f) other processes, such as thermal processes, e.g., bump reflow, and rapid thermal processes (RTPs) for annealing various layers of the devices described herein.

The method begins at an operation 100 with forming dielectric layer (DL) 14 on surface 13 of semiconductor substrate 22. In some embodiments, DL 14 is deposited on surface 13 using a CVD process or any other suitable process.

At an operation 102, the holes of TSVs 33 are formed through DL 14 and surface 13 into semiconductor substrate 22. The formation of the TSV holes may be carried out using suitable photolithography and etching processes.

In other embodiments, the formation of the TSV holes may be carried out using any other suitable technique, such as but not limited to laser ablation of substrate 22.

In some embodiments, a photolithography mask used in operation 102 may comprise holes having the same size, for producing solely TSVs 33, as shown in FIG. 1 above. In other embodiments, the photolithography mask may comprise holes having different sizes, such as for patterning diameters 39 and 59 in TSVs 33 and 55, respectively, as shown in FIG. 2 above.

At an operation 104, barrier layer 66 and attenuation layer 44 are formed within TSVs 33 and 55, on the surface of substrate 22.

In some embodiments, as shown in FIG. 2 above, TSV 33 may comprise attenuation layer 44 formed directly on the surface of substrate 22, and TSV 55 may comprise barrier layer 66 formed directly on the surface of substrate 22.

In other embodiments, TSV 33 may comprise (i) a barrier layer (such as barrier layer 66) formed on the surface of substrate 22, and (ii) attenuation layer 44 formed on the barrier layer.

In some embodiments, the barrier layer is formed by thermally growing oxide layer on the surface of substrate 22, e.g. using the aforementioned RTP process or a diffusion process, for oxidizing the surface of substrate 22 within the hole of TSV 33. In other embodiments, the barrier layer is formed by depositing silica or silicon-nitride using a CVD or other suitable process. Attenuation layer 44 is typically deposited over the barrier layer using a CVD or other suitable process.

At an operation 106, adhesion layer (not shown) and electrically conductive interconnect 34 are deposited on the surface of attenuation layer 44 (in TSVs 33) or on the surface of barrier layer 66 (in TSVs 55).

In some embodiments, the adhesion layer (e.g., titanium-nitride or tantalum-nitride) may be deposited using a PVD or other suitable process, on the attenuation and/or barrier layers, so as to obtain improved adhesion between (i) the attenuation and/or barrier layers and (ii) interconnect 34. In an embodiment, the adhesion layer may also serve as a diffusion barrier between the metal(s) of interconnect 34 and the dielectric materials of the attenuation layer or other layers formed within the TSV hole.

In some embodiments, interconnect 34 may be deposited on the surface of the adhesion layer, using a PVD or other suitable process and/or an ECP or other suitable process, and is typically filling the entire volume of the holes of the respective TSVs, as shown in FIGS. 1 and 2 above.

At an operation 108, the layers (e.g., barrier layer 66, attenuation layer 44, and the adhesion layer) and interconnect 34 formed within TSVs 33 and 55 (as described in operations 104 and 106) are removed from surface 23 of DL 14. The removal of the layers and interconnect 34 is typically carried out using one or more CMP processes and/or etch-back processes and/or other suitable process, and resulting in clearance of these layers from surface 23 of DL 14. Moreover, the removal of the barrier and attenuation layers is particularly important to enable electrical connection between M1 and interconnect 34 of TSVs 33 and 55, as shown, for example, in FIG. 2 above.

At an operation 110, the method comprises completion of various types of process operations for producing at least the interposer described in FIGS. 1 and 2 above. Such process operations may comprise, inter alia, the formation of IO module 42 by (i) depositing one or more passivation layer(s) 16 using a CVD process, (ii) deposition (e.g., using CVD or PVD or plating processes) and patterning (e.g., using photolithography and etching processes) of electrical traces 17 and micro-bumps 28.

At an operation 112, the backside of semiconductor substrate 22 is polished or etched-back for exposing surfaces 24 and 35, which are the lower surfaces of interconnect 34 of TSVs 33 and 55, respectively. In some embodiments, operation 112 is concluded when lower surface 20 of semiconductor substrate 22 is approximately flush with surfaces 24 and 35 of TSVs 33 and 55, respectively, and when lower surface 20 is parallel with and facing upper surface 13 of semiconductor substrate 22. Note that by exposing surfaces 24 and 35 of interconnect 34, TSVs 33 and 55 are configured to electrically connect between device 11 and the aforementioned lower device coupled to device 11.

At an operation 114 that concludes the method, connectors, such as UBMs 60 and 61, and bumps 62 and 63 are formed on surfaces 24 and 35 of TSVs 33 and 55, respectively. As described in FIGS. 1 and 2 above, the UBMs and the bumps are configured for connecting between device and e.g., the lower device, which is coupled to the bumps and optionally to surface 20 of devices 11 and 19.

In some embodiments, UBMs 60 and 61 are made from a conductive metal, such as aluminum or copper and may be produced using any suitable deposition process, such as but not limited to plating, electroplating, PVD or CVD. Bumps 62 and 63 may comprise solder bumps or any other suitable types of bumps produced using any suitable deposition process (e.g., plating), patterning process described above, and the aforementioned bump reflow processes.

This particular order of operations in the method of FIG. 3 is provided by way of example for addressing problems that are solved using the embodiments described above. The method, however, is not limited to this particular operational order, and the embodiments described in the method of FIG. 3, as well as in the description of devices 11 and 19, may be implemented, mutatis mutandis, in other processes for producing other devices. For example, the operational order may alter between "TSV first" and "TSV last" process sequences known in the art, which are also know in the art as "via first" and "via last," respectively.

Although the embodiments described herein mainly address 3D integration and packaging of multiple devices configured to carry high-speed data signals, the methods and devices described herein can also be used in other applications, such as in heterogeneous integration of different types of multiple semiconductor devices, which are implemented in 2.5D and 3D packaging technologies. Such packaging techniques may be used for integrating stacked memory devices. For example, (i) dynamic random access memory (DRAM) devices stacked in a high bandwidth memory (HBM) package, (ii) a stack of static RAM (SRAM) devices, and (iii) any other type of memory devices, such as but not limited to magneto-resistive RAM (MRAM) devices. Moreover, the disclosed techniques may be used in vertical integration of multiple logic device, and a combination of logic, memory and additional types of devices, such as sensing devices.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A device, comprising:
a semiconductor substrate having first and second surfaces facing one another; and
multiple through-silicon vias (TSVs) formed through the substrate between the first and second surfaces, the multiple TSVs comprising:
one or more first TSVs, comprising (i) an electrically conductive interconnect, which is formed within the first TSVs and is configured to conduct first electrical signals between the first and second surfaces, and (ii) an attenuation layer, which is formed of a material deposited within the first TSVs, between the substrate and the electrically conductive interconnect, the attenuation layer configured to attenuate interference between electrical signals carried by two or more of the TSVs; and
one or more second TSVs that are separate from the first TSVs, wherein the second TSVs (i) comprise the electrically conductive interconnect for conducting second electrical signals between the first and second surfaces, (ii) do not have the attenuation layer, and (iii) have a barrier layer configured to prevent diffusion between the substrate and the electrically conductive interconnect.

2. The device according to claim 1, wherein the attenuation layer comprises a dielectric layer having a dielectric constant smaller than 2.9.

3. The device according to claim 1, wherein the attenuation layer comprises a dielectric layer having a thickness greater than 50 nm.

4. The device according to claim 1, wherein the one or more second TSVs are configured to conduct second signals, different from the first signals.

5. The device according to claim 1, wherein at least one of the first TSVs is positioned between two or more of the second TSVs.

6. The device according to claim 1, wherein the attenuation layer and the barrier layer differ in thickness from one another.

7. The device according to claim 1, wherein the attenuation layer and the barrier layer differ in dielectric constant from one another.

8. The device according to claim 1, wherein the attenuation layer and the barrier layer differ in material composition from one another.

9. The device according to claim 1, wherein at least one of the first TSVs and at least one of the second TSVs differ in diameter from one another.

10. The device according to claim 9, wherein the first TSVs are larger in diameter than the second TSVs.

11. The device according to claim 4, wherein the first TSVs are configured to carry data signals, and wherein at least some of the second TSVs are configured to carry direct current (DC) signals.

12. The device according to claim 1, wherein the interference comprises electrical-signal coupling between the electrical signals carried by two or more of the TSVs.

13. A method for producing a device, the method comprising:
forming, through a substrate having first and second surfaces facing one another, multiple through-silicon vias (TSVs);
forming within one or more first TSVs among the TSVs:
an electrically conductive interconnect for conducting first electrical signals between the first and second surfaces, and an attenuation layer, which is formed of a material deposited between the substrate and the electrically conductive interconnect, for attenuating interference between electrical signals carried by two or more of the TSVs; and forming within one or more second TSVs among the TSVs, which are separate from the first TSVs, the electrically conductive interconnect for conducting second electrical signals between the first and second surfaces, and a barrier layer for preventing diffusion between the substrate and the electrically conductive interconnect, but not the attenuation layer.

14. The method according to claim 13, wherein forming the attenuation layer comprises forming a dielectric layer having a dielectric constant smaller than 2.9.

15. The method according to claim 13, wherein forming the attenuation layer comprises forming a dielectric layer having a thickness greater than 50 nm.

16. The method according to claim 13, wherein forming the one or more first and second TSVs comprises positioning at least one of the first TSVs between two or more of the second TSVs.

17. The method according to claim 13, wherein forming the one or more first and second TSVs comprises forming the attenuation layer and the barrier layer to differ in thickness one from the other.

18. The method according to claim 13, wherein forming the one or more first and second TSVs comprises forming the attenuation layer and the barrier layer to differ in dielectric constant one from the other.

19. The method according to claim 13, wherein forming the one or more first and second TSVs comprises forming the attenuation layer and the barrier layer to have different material composition one from the other.

20. The method according to claim 13, wherein forming the one or more first and second TSVs comprises forming at least one of the first TSVs and at least one of the second TSVs to differ in diameter one from the other.

21. The method according to claim 20, wherein forming the one or more first and second TSVs comprises forming the first TSVs to be larger in diameter than the second TSVs.

22. The method according to claim 13, wherein attenuating the interference comprises attenuating an electrical-signal coupling between the electrical signals carried by two or more of the TSVs.

* * * * *